(12) United States Patent
Micko

(10) Patent No.: US 7,352,107 B2
(45) Date of Patent: Apr. 1, 2008

(54) TRANSCONDUCTANCE CIRCUIT FOR PIEZOELECTRIC TRANSDUCER

(75) Inventor: Eric Scott Micko, Rescue, CA (US)

(73) Assignee: Suren Systems, Ltd., Hong Kong (HK)

( * ) Notice: Subject to any disclaimer, the term of this patent is extended or adjusted under 35 U.S.C. 154(b) by 285 days.

(21) Appl. No.: 11/298,541

(22) Filed: Dec. 9, 2005

(65) Prior Publication Data

US 2006/0152109 A1 Jul. 13, 2006

Related U.S. Application Data

(63) Continuation-in-part of application No. 10/918,080, filed on Aug. 13, 2004, now Pat. No. 7,141,910, which is a continuation-in-part of application No. 10/812,603, filed on Mar. 30, 2004, now Pat. No. 7,042,134.

(60) Provisional application No. 60/459,516, filed on Mar. 31, 2003.

(51) Int. Cl.
*H01L 41/08* (2006.01)
(52) U.S. Cl. .................. 310/316.01; 310/317
(58) Field of Classification Search .......... 310/316.01, 310/31, 7, 319
See application file for complete search history.

(56) References Cited

U.S. PATENT DOCUMENTS

| | | | |
|---|---|---|---|
| 5,115,292 A * | 5/1992 | Takebe et al. | 257/415 |
| 6,028,491 A | 2/2000 | Stanchak et al. | 310/314 |
| 6,340,816 B1 | 1/2002 | Micko | 250/338.3 |
| 6,448,689 B2 | 9/2002 | Satoh | 310/316.01 |
| 6,647,764 B1 | 11/2003 | Paul et al. | 73/54.41 |
| 6,741,137 B1 | 5/2004 | Sibrai et al. | 331/109 |
| 6,848,299 B2 | 2/2005 | Paul et al. | 73/64.53 |
| 7,042,134 B2 * | 5/2006 | Micko | 310/316.01 |
| 7,141,910 B2 * | 11/2006 | Micko | 310/316.01 |

OTHER PUBLICATIONS

PerkinElmer Optoelectronics; "Elementorientation and Connections LHI 2068"Drawing No. 2/71197; May 14, 2001.

* cited by examiner

*Primary Examiner*—Mark Budd
(74) *Attorney, Agent, or Firm*—John L. Rogitz

(57) ABSTRACT

A transconductance monitoring and amplifying circuit for a piezoelectric transducer that may be used in, e.g., a motion detector system includes a FET, with the transducer (and, hence, the signal voltage reference) floating between the gate and source of the FET, as opposed to being connected to the common ground of the circuit. This permits the development of a larger detector signal and concomitantly the use of a relatively inexpensive FET instead of a relatively more expensive high impedance operational amplifier as must be used in conventional transconductance circuits. The FET and transducer can be held in a single four-pin package. A discrete time sampled operational amplifier may also be used.

17 Claims, 5 Drawing Sheets

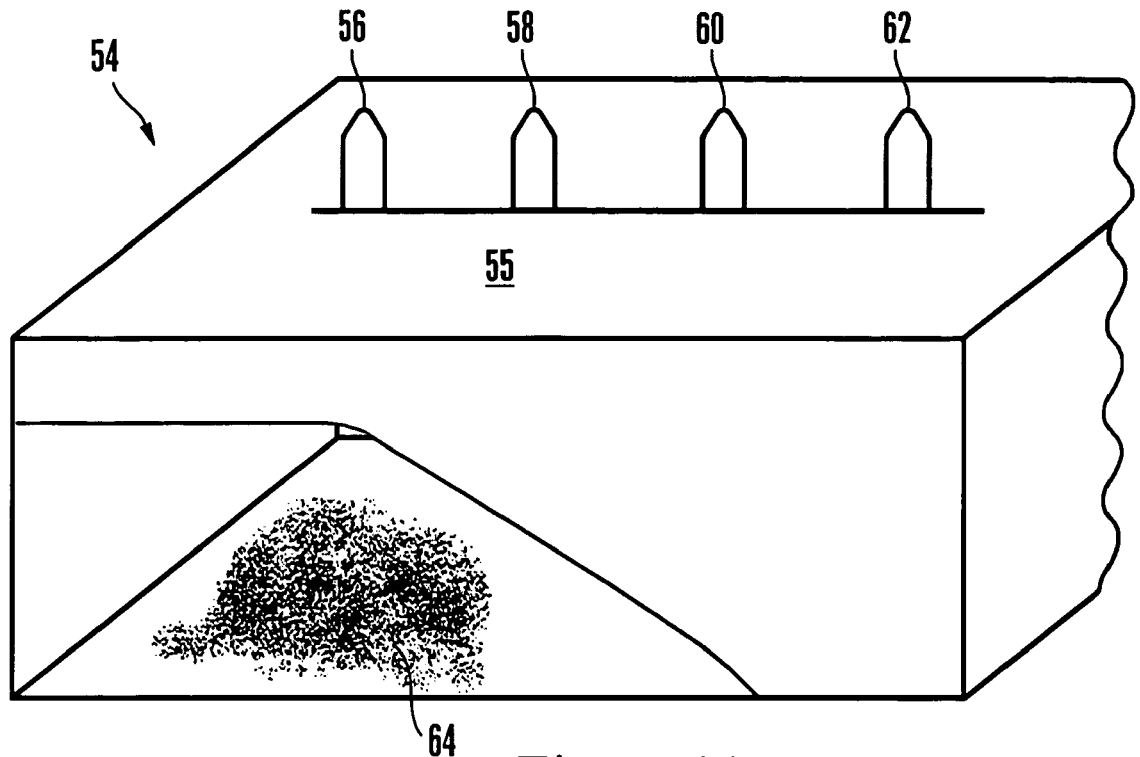
Figure 11
Figure 12
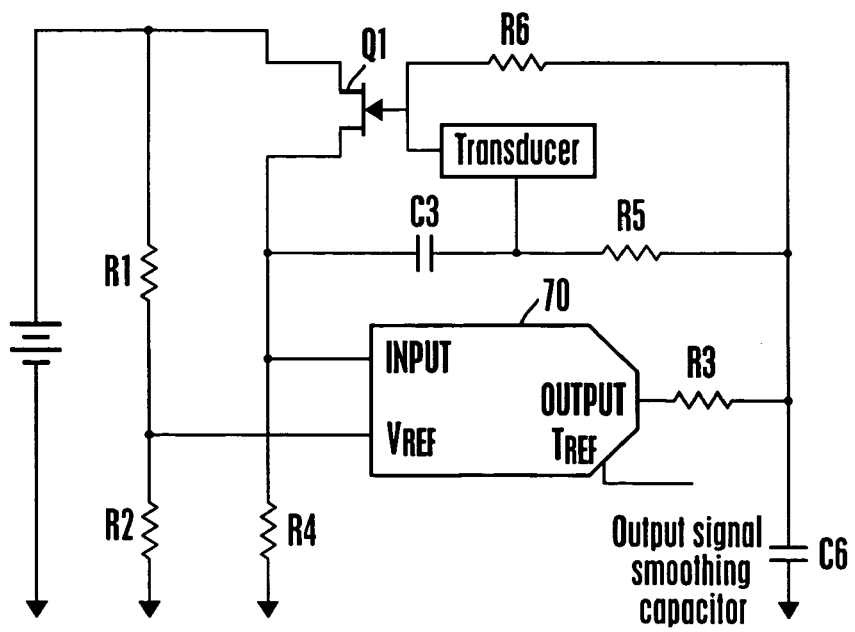

TRANSCONDUCTANCE CIRCUIT FOR PIEZOELECTRIC TRANSDUCER

RELATED APPLICATIONS

This is a continuation-in-part of and claims priority from U.S. patent application Ser. No. 10/918,080, filed Aug. 13, 2004, now U.S. Pat. No. 7,141,910 which is a CIP of Ser. No. 10/812,603, filed Mar. 30, 2004, now U.S. Pat. No. 7,042,134 claiming priority in turn from U.S. provisional application Ser. No. 60/459,516, filed Mar. 31, 2003, all of which are incorporated herein by reference.

FIELD OF THE INVENTION

The present invention relates generally to piezoelectric transducer systems.

BACKGROUND OF THE INVENTION

Piezoelectric sensor systems are used in a wide variety of applications. As but one non-limiting example, some security systems detect movement in a monitored space using passive infrared (PIR) motion sensors, which detect changes in far infrared radiation (8-14 micron wavelength) due to temperature differences between an object (e.g. a human) and its background environment. Upon detection, motion sensors generally transmit an indication to a host system, which may in turn activate an intrusion "alarm", change room lighting, open a door, or perform some other function. Such sensors advantageously are simple and relatively inexpensive.

The detectors of a PIR sensor can include pyroelectric detectors that measure changes in far infrared radiation. Such detectors operate by the "piezoelectric effect", which causes electrical charge migration in the presence of mechanical strain. Pyroelectric detectors take the form of a capacitor—two electrically conductive plates separated by a dielectric. The dielectric can be a piezoelectric ceramic. When far infrared radiation causes a temperature change (and thus some mechanical strain) in the ceramic, electrical charge migrates from one plate to the other. If no external circuit (or a very high impedance circuit) is connected to the detector ("voltage output mode"), then a voltage that can be measured appears as the "capacitor" charges. If an external circuit of relatively low impedance is connected between the plates ("current output mode"), then a current flows.

A piezoelectric detector in the current output mode is placed in a transconductance amplifier circuit, in which, in lieu of allowing the voltage between the plates of the transducer to change substantially, charge is conducted through a feedback resistor of a high impedance operational amplifier to create a voltage that establishes the output signal of the circuit. By "high" impedance is meant an impedance of at least $10^7$ Ohms.

The present invention is directed to providing inexpensive versions of transconductance circuits. As understood herein, heretofore transconductance circuits for piezoelectric detectors have required relatively expensive high impedance operational amplifiers as a result of having to measure small amounts of charge produced by piezoelectric detectors. As further understood herein, less expensive circuits can be provided using the inventive concepts herein.

SUMMARY OF THE INVENTION

Several versions of a transconductance circuit for, e.g., a piezoelectric far infrared radiation detector that may be implemented in an infrared motion sensor are disclosed.

Accordingly, a piezoelectric detector includes a piezoelectric transducer and a transconductance circuit electrically connected to the transducer. The transconductance circuit includes a field effect transistor (FET) and a transconductance resistor connected to the gate of the FET. The circuit also includes a discrete time sampled operational amplifier-based constant multiplying circuit.

The transconductance circuit can define a common ground and a signal voltage reference that is not directly connected to the common ground. A feedback circuit signal may be derived from the source of the FET. In some implementations the FET source signal can be connected to the input voltage line of the discrete time sampled operational amplifier-based constant multiplying circuit, and more specifically may be connected to the input voltage line of an analog to digital converter of the discrete time sampled operational amplifier circuit.

In another aspect, a piezoelectric detector package includes a housing and a piezoelectric transducer in the housing. A discrete time sampled operational amplifier circuit is operably engaged with the piezoelectric transducer. In non-limiting embodiments the piezoelectric transducer can be connected to the input line of the discrete time sampled operational amplifier circuit.

In yet another aspect, a discrete time sampled operational amplifier (DTSOA)-based transconductance circuit includes a reference voltage, an input line, a piezoelectric transducer connected from the reference voltage to the input line, and an amplifier receiving signals on the input line and generating an output based on the transducer signal. A feedback element through which the output is sent back to the input line is also provided. The feedback element may be, e.g., a resistor or a charge-switching circuit.

In non-limiting implementations the transconductance circuit includes a comparator connected to the input line and sending signals to a digital logic processing circuit, which in turn generates a digital output. The output represents the transducer signal. If desired, the digital logic circuit can be established by a microcontroller.

In another aspect, a discrete time sampled operational amplifier (DTSOA) circuit includes an input line and an FET- or operational amplifier-based transconductance circuit in the input line. A DTSOA-based differentiator (or "delta-modulator") circuit receives signals on the input line and generates an output. If desired, a feedback element can be provided through which the output is sent back to the input line.

The details of the present invention, both as to its structure and operation, can best be understood in reference to the accompanying drawings, in which like reference numerals refer to like parts, and in which:

BRIEF DESCRIPTION OF THE DRAWINGS

FIG. 11 is a perspective view of a transducer package;

FIG. 12 is a schematic diagram of a modified version of the fourth embodiment shown in FIG. 9, using a discrete time sampled operational amplifier in lieu of an analog operational amplifier;

DETAILED DESCRIPTION OF THE PREFERRED EMBODIMENT

Figure 1:
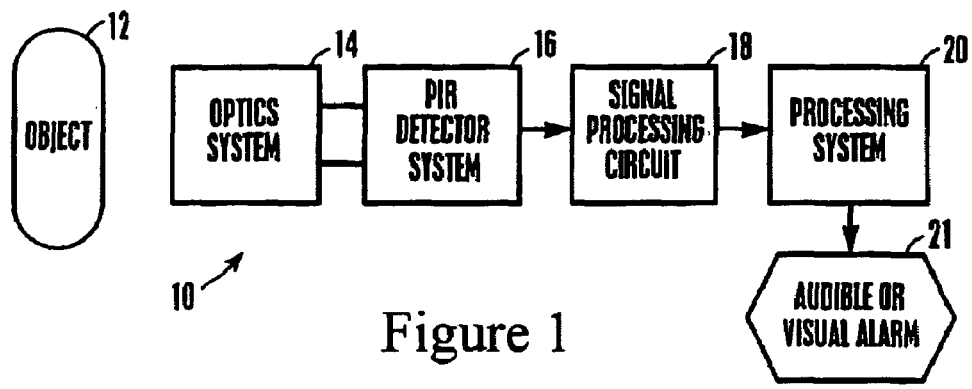
FIG. 1 is a block diagram of the present system architecture.

Referring initially to FIG. 1, an exemplary non-limiting system is shown, generally designated 10, for detecting a moving object 12, such as a human. The system 10 includes an optics system 14 that can include appropriate mirrors, lenses, and other components known in the art for focussing images of the object 12 onto a passive infrared (PIR) detector system 16. In response to the moving object 12, the PIR detector system 16 generates a signal that can be filtered, amplified, and digitized by a signal processing circuit 18, with a processing system 20 (such as, e.g., a computer or application specific integrated circuit) receiving the signal and determining whether to activate an audible or visual alarm 21 or other output device such as an activation system for a door, etc.

Figure 2:
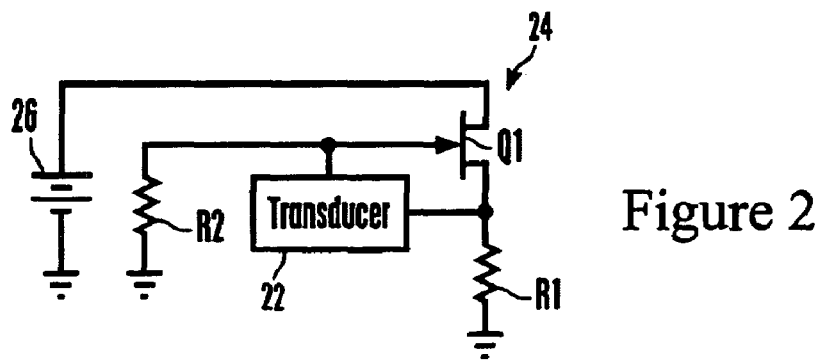
FIG. 2 is a schematic diagram of a first embodiment of the present transconductance circuit.

Having described one application of the piezoelectric detector of the present invention, attention is now directed to FIGS. 2-5, which show various implementations of the present inventive concept. As shown in FIG. 2, a piezoelectric transducer 22 is provided in a transconductance circuit 24 having a direct current (DC) voltage supply 26. The circuit 24 can be thought of as a monitoring circuit for the piezoelectric transducer 22. Also, the circuit 24 impedance-buffers and amplifies the signal from the transducer 22.

In accordance with present principles, a "transconductance circuit" is one in which, in lieu of allowing the voltage between the plates of a transducer such as the transducer 22 to change substantially, charge is conducted through a resistor to create a voltage that establishes the output signal of the circuit.

The piezoelectric transducer 22 can be any piezoelectric transducer. In one exemplary illustration the piezoelectric transducer 22 is a pyroelectric detector that measures changes in far infrared radiation by the "piezoelectric effect", which causes electrical charge migration in the presence of mechanical strain that can be induced by, e.g., far infrared radiation-induced temperature change. The piezoelectric transducer 22 may take the form of a capacitor, i.e., two electrically conductive plates separated by a dielectric which can be a piezoelectric ceramic. When the ceramic of the piezoelectric transducer 22 experiences mechanical strain, electrical charge migrates from one plate to the other plate.

In the circuit 24 shown in FIG. 2, the transducer 22 is connected between the source and the gate of a junction field effect transistor (FET) Q1 that may be implemented by a type 2N4338 FET in a non-limiting embodiment. The power supply 26, which can be a five volt power supply established by one or more dry cell batteries, is connected to the drain of the FET Q1 as shown.

As shown in FIG. 2, the source current of the FET Q1 is changed to a voltage by passing it through an output resistor R1. The voltage is connected via a transconductance resistor R2 and causes a current to flow back to the gate of the FET Q1, with both resistors R1, R2 being connected to ground but with the transducer 22 "floating" (i.e., with its signal reference voltage not connected to ground) between the source and gate of the FET Q1.

With the above structure, the skilled artisan will recognize that the FET Q1 controls the feedback current through the transconductance resistor R2 to the gate of the FET Q1 by varying the voltage across the output resistor R1, which, via the ground node, impresses the same changing voltage across the transconductance resistor R2. The alternating current (AC) component of the output of the circuit 24, which can be mathematically calculated in sufficient accuracy to reflect essential circuit function by multiplying the output current of the transducer 22 by the resistance of the transconductance resistor R2, is measured across the output resistor R1. The direct current (DC) component of the output is determined by the gate-source operating voltage of the FET Q1.

In other words, the signal voltage reference node of the circuit 24 floats with respect to the circuit common ground, in contrast to conventional non-transconductance circuits in which the signal voltage reference node is grounded and the FET is used as a buffer for a piezoelectric detector operated in a voltage output mode. Consequently, the present combination of transconductance circuit structure produces the characteristic larger signal voltage as compared to conventional voltage output mode circuits, while advantageously permitting the use of a relatively inexpensive FET Q1 of the same type as used in conventional voltage output mode circuits in lieu of a relatively more expensive high impedance operational amplifier. Viewed another way, the circuit 24 shown in FIG. 2 in essence has three functional blocks, namely, the transducer 22, the FET Q1, and the transconductance resistor R2, with the latter being a feedback element, in contrast to conventional voltage output mode circuits.

Figure 3:
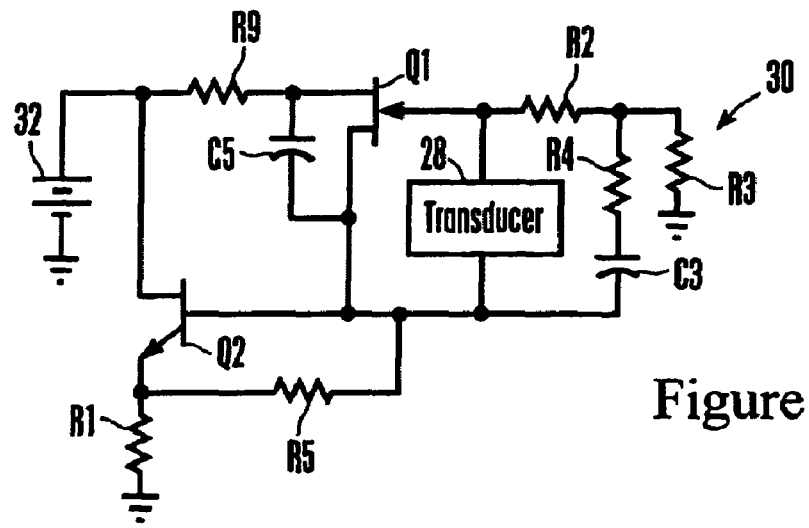
FIG. 3 is a schematic diagram of a second embodiment of the present transconductance circuit.
Figure 4:
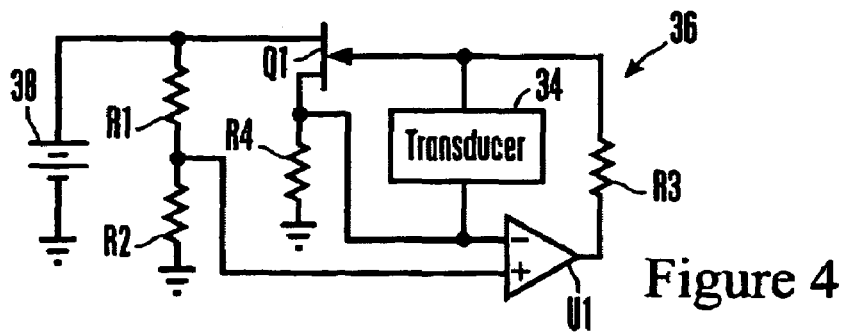
FIG. 4 is a schematic diagram of a third embodiment of the present transconductance circuit.
Figure 5:
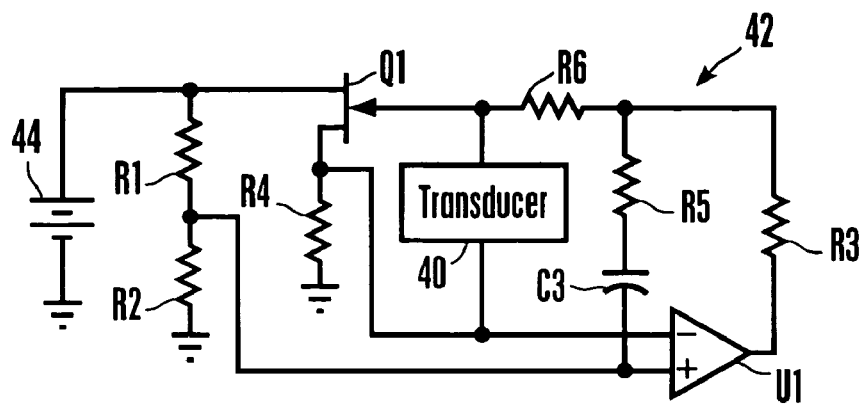
FIG. 5 is a schematic diagram of a fourth embodiment of the present transconductance circuit.

FIGS. 3-5 show various circuits that add components to those of FIG. 2 to increase even further the signal developed by the circuits. As shown in FIG. 3, a piezoelectric transducer 28 is provided in a transconductance circuit 30 having a DC voltage supply 32. In the circuit 30 shown in FIG. 3, the transducer 28 is connected between the source and the gate of a junction field effect transistor (FET) Q1 and, thus, the signal voltage reference of the circuit 30 floats with respect to the circuit common ground. The power supply 32 is connected to the drain of the FET Q1 as shown through a drain resistor $R_D$.

In the circuit shown in FIG. 3, not only is the FET Q1 provided, but a bipolar junction transistor (BJT) Q2 as well, in addition to further circuit elements discussed below. If desired, an inexpensive standard input impedance operational amplifier may be used instead of the BJT Q2. By "standard input impedance" is meant an impedance of no more than $10^7$ Ohms.

In the embodiment shown in FIG. 3, the base of the BJT Q2 is connected to the transducer 28 and to the source of the FET Q1 as shown, with the emitter of the BJT Q2 being connected to grounded output resistor R1 and with the collector of the BJT Q2 being connected to the power supply 32 and being separated from the drain of the FET Q1 by the drain resistor R9. Because of the extra gain provided by the BJT Q2 and because its base is connected to the source of the FET Q1, an output feedback voltage divider that is established by resistors R3, R4 and a capacitor C3 can be added so as to amplify the basic transconductance voltage developed across a transconductance resistor R2 by, for example, ten, with this voltage being fed back as a current to the gate of the FET Q1 through the transconductance resistor R2. Thus, the AC component of the output of the circuit 30 (as measured across the output resistor R1) in FIG. 3 may be ten times that of the circuit 24 shown in FIG. 2, given the same stimulus energy to the transducers of both circuits.

Additionally, in the circuit 30 shown in FIG. 3 the drain of the FET Q1 is essentially short-circuited (for AC signals) by a shorting capacitor C5 to the source of the FET Q1, which, as noted previously, is the signal voltage reference node. With the FET Q1 drain essentially short-circuited to the signal voltage reference node, the internal capacitance of the FET Q1 no longer establishes an undesirable feedback element, extending the high frequency response of the circuit 30.

Now referring to FIG. 4, a piezoelectric transducer 34 is provided in a transconductance circuit 36 having a DC voltage supply 38. In the circuit 36 shown in FIG. 4, the transducer 34 is connected between the source and the gate of a junction field effect transistor (FET) Q1 and, thus, the signal voltage reference of the circuit 36 floats with respect to the circuit common ground. The power supply 38 is connected to the drain of the FET Q1 as shown.

In the embodiment shown in FIG. 4, an inexpensive standard input impedance operational amplifier U1 has its inverting input connected to the transducer 34 and to the source of the FET Q1, which is indirectly connected to ground (i.e., through a resistor R4). The output of the operational amplifier U1 is fed back to the gate of the FET Q1 through a transconductance resistor R3. Also, the non-inverting input of the operational amplifier U1 is connected to a voltage divider consisting of a resistor R1, which in turn is connected to the power supply 38, and a resistor R2, which is connected to ground.

As was the case in the previously-described circuits, the voltage across the FET source resistor R2 that is developed from the source current is fed back as a current to the gate of the FET Q1. The feedback path extends through the operational amplifier U1 in the circuit 36 shown in FIG. 4 and through a transconductance resistor R3. The transconductance current summing node is at the gate of the FET Q1, which buffers the inverting input of the operational amplifier U1. The non-inverting input of the operational amplifier U1 is the "floating" signal voltage reference node for the circuit 36. The operational amplifier U1 varies its output voltage to control the feedback current through the transconductance resistor R3, with the output signal of the circuit being the AC component of the output voltage of the operational amplifier U1, the DC component being determined by the gate-source operating voltage of FET Q1.

The circuit 36 in FIG. 4 provides an essentially constant voltage (maintained by the operational amplifier U1 at its inverting input) for a signal voltage reference node. Accordingly, the FET Q1 drain-gate voltage is essentially constant compared to the amplifier output and feedback voltage fed back as a current through the transconductance resistor R3 to the gate of the FET Q1. Consequently, there is no high frequency limit due to any effect of the FET Q1 internal drain-gate capacitance, so a resistor-capacitor pair R9-C5 shown in the transistor-only circuit of FIG. 3 is not required in the circuit 36 of FIG. 4.

FIG. 5 shows a piezoelectric transducer 40 in a transconductance circuit 42 having a DC voltage supply 44 that in all essential respects is identical to the circuit 36 shown in FIG. 4, except that a resistor R5 and a capacitor C3 are provided between the non-inverting input of an operational amplifier U1 and a feedback resistor R3, a transconductance resistor R6 being provided between the tap of the resistor R5/capacitor C3 pair and the gate of the FET Q1. Because of the ample gain provided by the operational amplifier U1, the output voltage divider established by the resistors R3 and R5 and the capacitor C3 can amplify the basic transconductance voltage by, e.g., ten.

FIGS. 6-9 respectively correspond to FIGS. 2-5, with the respective circuits being essentially identical as shown except that in the variations shown in FIGS. 6-9, the AC and DC connections to the transducer are separated from each other, so as to avoid such high DC outputs that the circuit enters a condition known as "saturation" where the circuit DC output voltage should be (from an ideally calculated standpoint) more positive than the positive end of the power supply or more negative than the negative end of the power supply. Since this is not possible in reality, the circuit DC output can become "stuck" against either the positive or negative end of the power supply, in which case no AC signals are possible, otherwise rendering the circuit totally non-functional. Such high DC outputs could result from DC amplification due to the parallel leakage resistance present in some transducers. When functioning properly the circuits shown in FIGS. 6-9 operate just like their respective counterparts in FIGS. 2-5, because it is the AC signal that is used in the present invention, not the DC signal.

Figure 6:
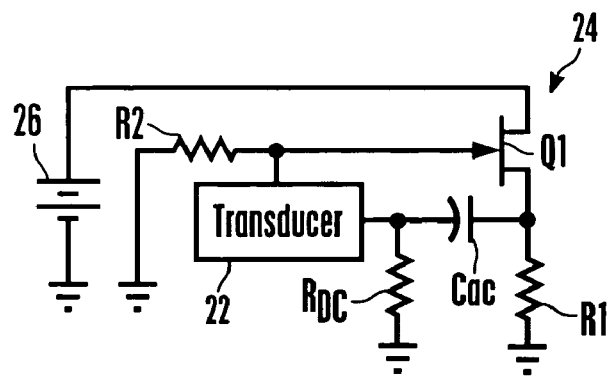
FIG. 6 is a schematic diagram of a modified version of the first embodiment shown in FIG. 2, wherein the alternating current (AC) and direct current (DC) connections to the transducer are separated from each other to avoid DC outputs that, if sufficiently high, might otherwise saturate the circuit.
Figure 7:
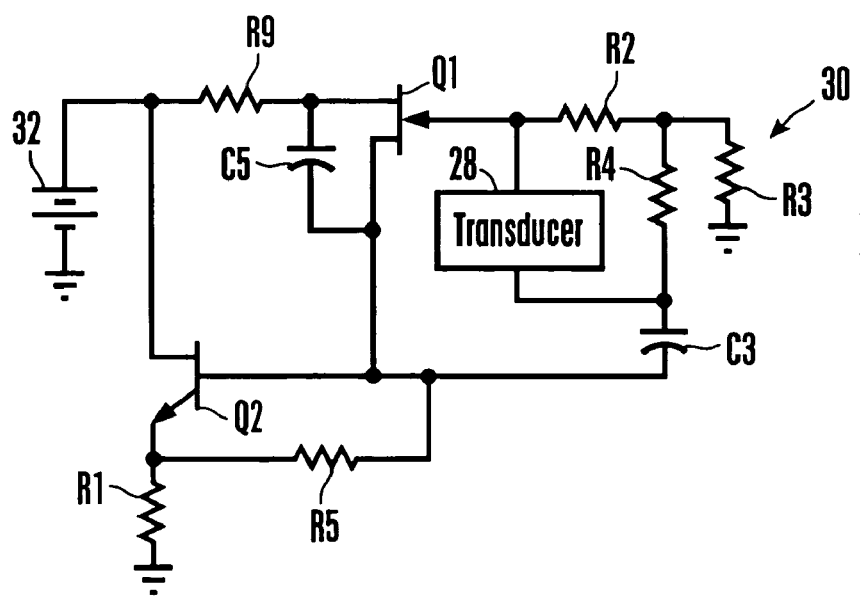
FIG. 7 is a schematic diagram of a modified version of the second embodiment shown in FIG. 3, wherein the AC and DC connections to the transducer are separated from each other.
Figure 8:
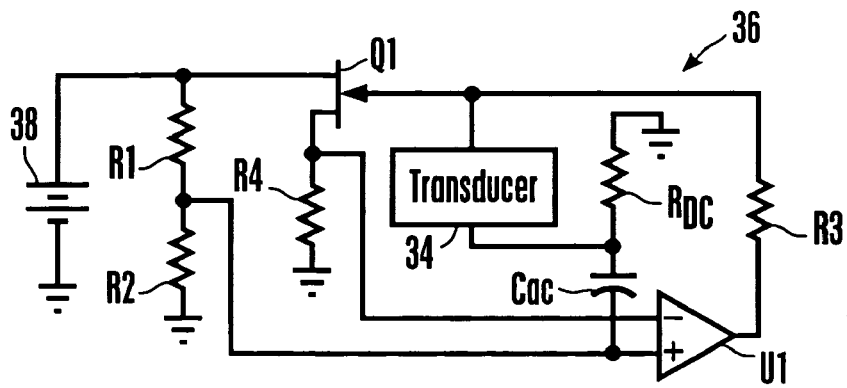
FIG. 8 is a schematic diagram of a modified version of the third embodiment shown in FIG. 4, wherein the AC and DC connections to the transducer are separated from each other.
Figure 9:
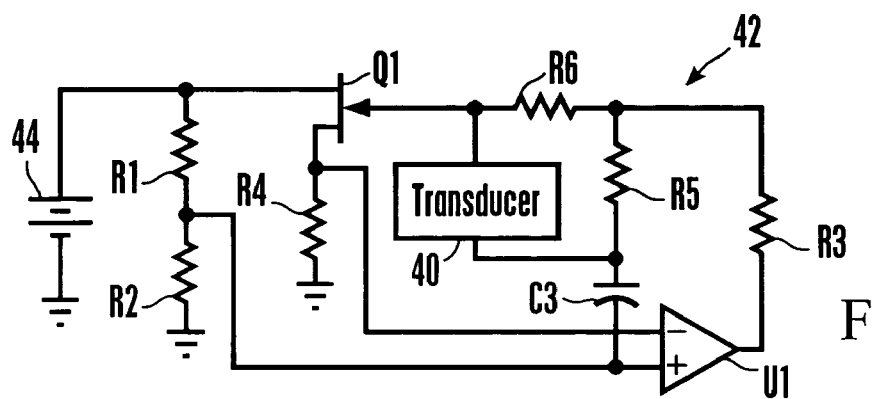
FIG. 9 is a schematic diagram of a modified version of the fourth embodiment shown in FIG. 5, wherein the AC and DC connections to the transducer are separated from each other.

The above separation of AC from DC is accomplished in FIGS. 6 and 8 by passing the AC component of the transducer output signal through an AC-passing DC-blocking capacitor $C_{AC}$ and thence to the signal processing circuitry, i.e., to the FET Q1 in FIG. 6 and to the operational amplifier U1 in FIG. 8, while shunting the DC component of the transducer output signal to ground through a DC grounding resistor $R_{DC}$. In FIGS. 7 and 9, on the other hand, recognizing that an AC-passing, DC-blocking capacitor C3 already exists in these circuits, the outputs of the respective transducers are connected to a line between the capacitor C3 and resistor (R4 in FIG. 7, R5 in FIG. 9) in these circuits.

Figure 10:
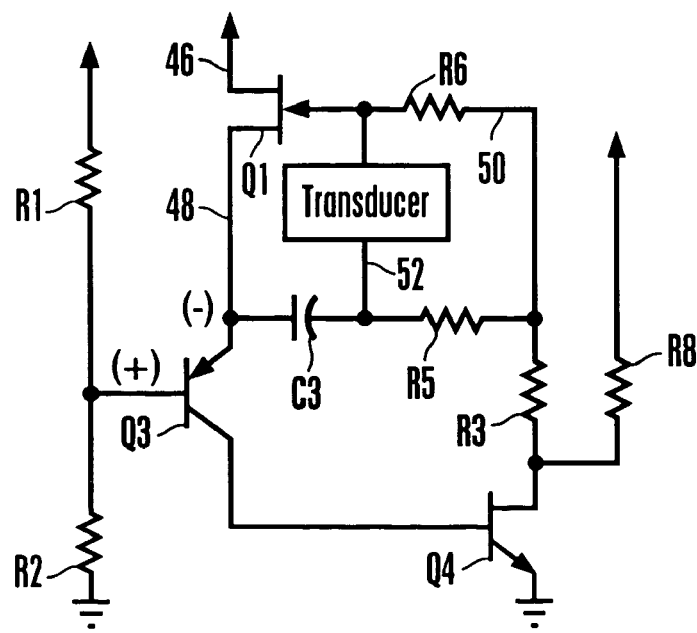
FIG. 10 is a schematic diagram of still another alternate embodiment of the present transconductance circuit.

FIG. 10 shows a circuit similar to that shown in FIG. 9, wherein like reference numerals refer to like parts, but wherein the operational amplifier U1 is replaced with a PNP transistor Q3 in cascade with an NPN transistor Q4 to achieve a less expensive implementation. More specifically, in FIG. 10 a transconductance resistor R6 is connected to the gate of the FET Q1, the drain of which is connected to a power supply line 46 and the source of which is connected, through an output line 48 having disposed in it a PNP transistor Q3, to a voltage divider circuit that includes the resistors R1 and R2, which provide a bias voltage signal for operation of the FET Q1 by establishing its source voltage. The PNP transistor Q3 buffers this bias signal to establish the FET Q1 source bias voltage. Also, as shown the transistor Q3 passes the FET drain-to-source output current to the base of the NPN transistor Q4, where, because of the gain of the transistor Q4, a proportionately larger transistor output current (collector-emitter current) is developed that is in turn converted back to a voltage by a load resistor that is connected to the power supply voltage.

A feedback signal from the source of the FET Q1 is provided as before to the transconductance resistor R6 through a feedback line 50, and as discussed above in the specific circuit shown in FIG. 10 it is provided through the PNP transistor Q3 and through the NPN transistor Q4 and feedback resistor R3. The piezoelectric transducer is connected via a transducer line 52 and a capacitor C3 (in a voltage divider portion of the circuit) which provides an AC connection to the signal voltage reference node, as shown in accordance with principles set forth above in relation to FIGS. 5 and 9.

All of the above circuits include a piezoelectric transducer and a transconductance resistor that are connected together to a gate of a FET, and the drain of the FET is connected to a power supply and the source is connected to a feedback portion of the circuit. FIG. 11 shows that the piezoelectric transducer, FET, and transconductance resistor may be provided in a single package for convenience, with four connectors such as but not limited to pins being provided on the package to connect the transducer, FET source, FET gate, and transconductance resistor to the circuit described above. Other connector structure, e.g., sockets, pads, wires that can be soldered, etc. can be used, as long as the connectors are accessible from outside the housing.

Accordingly, FIG. 11 shows a package structure, generally designated 54, which includes a hollow, parallelepiped-shaped housing 55 that includes four external connectors, 56, 58, 60, 62, such as but not limited to pins. The hollow housing 55 holds the present piezoelectric transducer, FET, and transconductance resistor in any of the circuits shown above. Accordingly, the first and second connectors 56 and 58 may be electrically connected to the FET within the housing 55. More specifically, the first connector 56 may be connected to the drain of the FET and, using the circuit shown in FIG. 10 for illustration, may be externally connected, by means of a complementarily-shaped connector, to the line 46 to thereby connect the FET drain to the power supply. On the other hand, the second FET connector 58 is connected to the source of the FET within the housing 55, and it may engage a complementarily-shaped connector that in turn is connected to the line 48 in FIG. 10 to thereby connect the FET source to the portion of the circuit shown.

The third connector 60 may be internally connected to the transconductance resistor. The third connector 60 may then be externally engaged with a complementarily-shaped connector to connect the line 50 in FIG. 10 to the transconductance resistor R6 within the housing 55. The fourth connector 62 may be connected to the piezoelectric transducer contained inside the package structure 54. The fourth connector 62 may then be connected to the line 52 which, as shown in the illustrative circuit of the FIG. 10, connects the piezoelectric transducer at the FET gate to other circuit structure. It is preferred that the three components of the hollow housing package structure 54, i.e., the piezoelectric transducer, FET, and transconductance resistor, be packaged in dry nitrogen 64. It is to be understood that the physical connector arrangement shown in FIG. 10 is exemplary only, and that other connector arrangements (e.g., one connector on each of four sides of the housing 55) may be implemented.

With the above four-connector, three component package, the exceedingly small currents that are associated with very high resistances such as a typical transconductance resistor of 125 G Ohms) are all contained inside of the housing 55. The circuitry external to the transducer, FET, and transconductance resistor uses currents much higher than those that flow inside of the housing. Thus, while a single housing could be made to hold the entire circuit shown in, e.g., FIG. 10, such housings are quite expensive, whereas the simple four-pin package shown in FIG. 11, which can be made in just the right size to hold the aforementioned three parts, is inexpensive.

FIG. 12 shows a circuit that is in all essential respects identical to that shown in FIG. 9 (and that may, in accordance with principles discussed above, also be configured similar to FIG. 5 when ac-dc separation is not required) except that the analog operational amplifier U1 is replaced with a discrete time sampled operational amplifier (DTSOA) circuit 70 to save the cost of an analog operational amplifier, and a smoothing capacitor C6 has been added at the output of the DTSOA circuit 70 to smooth the digital output signal. Further cost savings may be realized by using an oscillating amplifier that performs similarly to the sampled amplifier.

In one general form, a discrete time sampled operational amplifier circuit may be constructed by summing input and feedback signals in analog form, with analog-to-digital converter and digital circuits providing high gain. However, it is to be understood that many embodiments of discrete time sampled operational amplifier circuits are contemplated herein, including the novel non-limiting device shown in FIG. 13.

Figure 13:
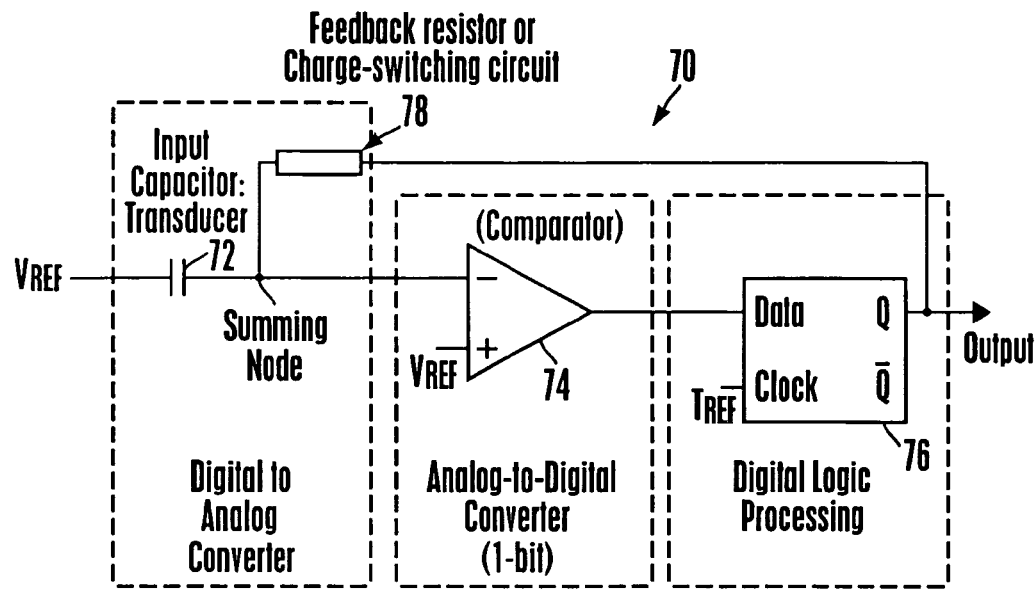
FIG. 13 is a schematic diagram of a non-limiting discrete time sampled operational amplifier-based transconductance circuit.

Accordingly, turning now FIG. 13, a schematic diagram is shown of a DTSOA feedback control circuit that uses the above-discussed piezoelectric transducer in a transconductance circuit, it being understood that alternatively, in other DTSOA applications, an input capacitor can be substituted for the transducer and an input voltage substituted for the reference voltage, thus to construct a DTSOA-based differentiator (or "delta-modulator"), or yet again an input resistor instead of a capacitor can be used, in conjunction with a capacitor connected from the comparator inverting input to the reference voltage or system ground, to achieve a DTSOA-based constant multiplication feedback control circuit of a type that may serve as the circuit 70 of FIG. 12.

In the novel non-limiting implementation shown, the piezoelectric transducer (designated 72 in FIG. 13 and illustrated functionally as a capacitor from the reference voltage line to a comparator 74) may be used as an input device of a transconductance circuit. It is to be understood that this is in contrast with the circuit in FIG. 12, wherein the transducer is connected in an analog transconductance circuit based on the FET Q1 and transconductance resistor R6, all of which is separate from the DTSOA-based constant multiplying circuit that serves the same function as an analog amplifier, as shown in FIG. 12.

In any case, returning to FIG. 13, the comparator 74 functions as an analog-to digital converter that outputs a digitized signal to processing logic 76. The output of the processing logic 76 may be fed back through a feedback resistor or charge-switching circuit 78 to the input line in which the piezoelectric transducer is disposed as shown, with the feedback resistor or charge-switching circuit 78, together with the transducer 72, establishing a digital to analog converter. Also, where the output of the processing logic 76 is fed back via a path additional to that inside the DTSOA, that output is sent through the smoothing capacitor C6 shown in FIG. 12.

With the above disclosure in mind, it may now be appreciated that digital signal low and high output states from the comparator 74, and the latched data output voltage of the processing circuit 76, may be zero and five volts, respectively, from a ground reference. The latch voltage logical input threshold of the processing circuit 76 may be two and a half volts. Reference voltages ($V_{ref}$) may be two and a half volts at both points, or separate reference voltages may be provided. The sampling reference time ($T_{ref}$) of the processing circuit 76 may be a period much shorter than the time constant created by the feedback resistor and transducer capacitance, so that those components may provide an average direct current voltage corresponding to the percentage of time that the latched voltage output from the processing circuit 76 spends in high versus low states. The circuit shown in FIG. 13 performs substantially identically to an analog transconductance circuit, with the exception that its output is digital, in the form of low or high voltages that are determined at each time-sampling. The time-average value of those digital voltages corresponds to the analog amplifier's steady-state output voltage.

In some applications, comparator and latch functions may be provided in a microcontroller, thus eliminating the relatively high cost of a separate analog comparator or amplifier. Also, as mentioned above the feedback may be provided via an active charge-switching circuit, to save the cost of the high-value resistor typically associated with piezoelectric transducers.

Figure 14:
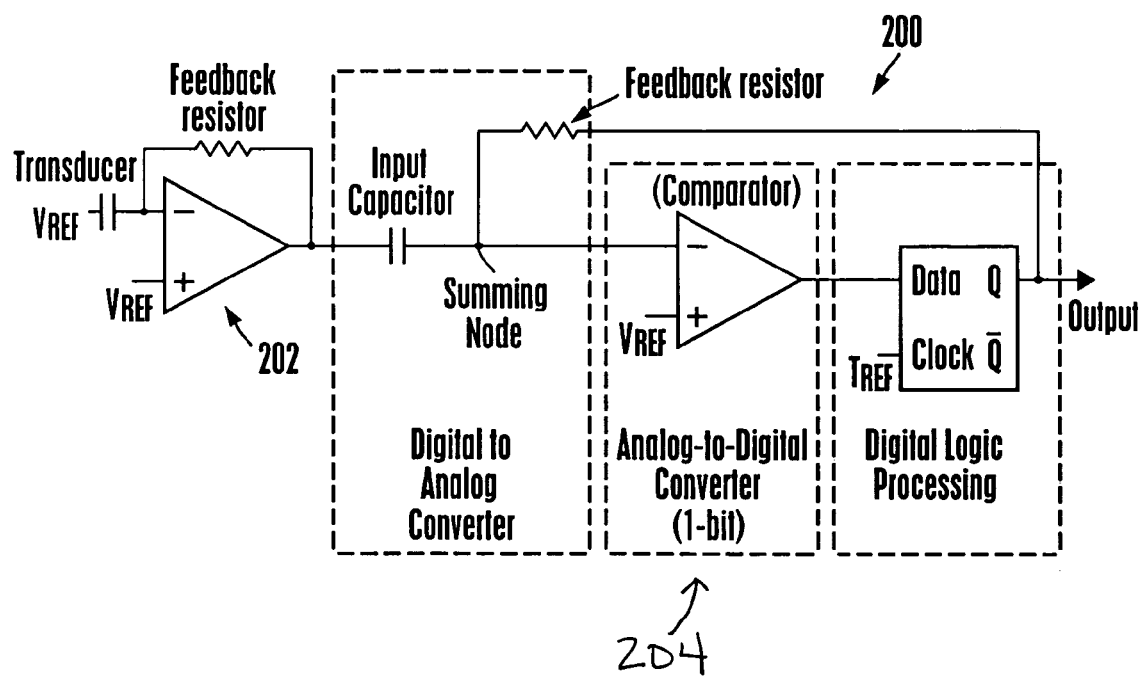
FIG. 14 is a schematic diagram of a non-limiting discrete time-sampled differentiator circuit with a conventional transconductance circuit at its input.

Now referring to FIG. 14, as understood herein, in some cases it may not be desirable or feasible to embed a transducer directly into a discrete-time-sampled operational amplifier-based transconductance circuit, yet it is still desirable to realize the advantages of operating a transducer in a transconductance circuit, and of obtaining a digitally-encoded output as from a discrete-time-sampled operational amplifier-based differentiator circuit. In such cases, either an operational amplifier-based transconductance circuit, or one of several JFET-based (or JFET/op-amp-based) transconductance circuits (as shown in U.S. patent application Ser. No. 10/812,603, and in its CIP, publication number 20040189149) can provide the first function of a buffered transducer output with a "flat" frequency response, whence the buffered output can drive the input of a discrete-time-sampled operational amplifier-based differentiator circuit, which, in turn, can provide a digitally encoded output.

FIG. 14 shows a circuit 200 in which an operational amplifier-based transconductance circuit 202 drives the input of a discrete-time-sampled operational amplifier-based differentiator circuit 204, which has a DAC and ADC essentially identical to those shown in FIG. 13. However, the DTSOA differentiator circuit 204, which is also widely called a "delta modulator", and which is commonly used to digitally encode analog signals, has an ordinary capacitor where the transducer is found in FIG. 13. If desired, either or both circuits in FIG. 14 may have a charge-switching feedback circuit (switched-capacitor) in lieu of the resistor.

While the particular TRANSCONDUCTANCE CIRCUIT FOR PIEZOELECTRIC TRANSDUCER as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. '112, sixth paragraph, unless the element is expressly recited using the phrase "means for" or, in the case of a method claim, the element is recited as a "step" instead of an "act". Absent express definitions herein, claim terms are to be given all ordinary and accustomed meanings that are not irreconcilable with the present specification and file history.

What is claimed is:

1. A piezoelectric detector, comprising:
    a piezoelectric transducer; and
    a transconductance circuit electrically connected to the transducer and including a field effect transistor (FET), the transconductance circuit including a transconductance resistor connected to the gate of the FET, the circuit including at least one discrete time sampled operational amplifier circuit.

2. The detector of claim 1, wherein the transconductance circuit defines a common ground and a signal voltage reference not directly connected to the common ground.

3. The detector of claim 2, comprising a feedback circuit signal derived from the source of the FET.

4. The detector of claim 1, wherein the FET source signal is connected to an input line of the discrete time sampled operational amplifier circuit.

5. The detector of claim 1, wherein the FET source signal is connected to an input line of an analog to digital converter of the discrete time sampled operational amplifier circuit.

6. A piezoelectric detector package, comprising:
    a housing;
    a piezoelectric transducer in the housing; and
    at least one discrete time sampled operational amplifier-based transconductance circuit operably engaged with the piezoelectric transducer.

7. The package of claim 6, wherein the transducer is connected from a reference voltage to an input line of the discrete time sampled operational amplifier circuit.

8. The package of claim 7, wherein the transducer is connected from a reference voltage to an input line of an analog to digital converter of the discrete time sampled operational amplifier circuit.

9. A discrete time sampled operational amplifier (DTSOA)-based transconductance circuit, comprising:
    at least one input line;
    a piezoelectric transducer in the input line;
    an amplifier circuit receiving signals on the input line and generating an output; and
    at least one feedback element through which the output is sent back to the input line.

10. The DTSOA circuit of claim 9, wherein the amplifier circuit includes at least one comparator connected to the input line and sending signals to at least one digital logic processing circuit generating the output, the output representing the signal on the input line.

11. The DTSOA circuit of claim 9, wherein the amplifier and logic processing circuit functions are established at least in part by a microcontroller.

12. The DTSOA circuit of claim 9, wherein the feedback element is a resistor.

13. The DTSOA circuit of claim 9, wherein the feedback element is a charge-switching circuit.

14. A transconductance circuit-driven discrete time sampled operational amplifier (DTSOA)-based differentiator circuit, comprising:
- at least one input line;
- an operational amplifier-based transconductance circuit in the input line; and
- a DTSOA-based differentiator ("delta-modulator") circuit receiving signals on the input line and generating an output.

15. The DTSOA circuit of claim 14, comprising at least one feedback element through which the output is sent back to the input line.

16. A transconductance circuit-driven discrete time sampled operational amplifier (DTSOA)-based differentiator circuit, comprising:
- at least one input line;
- a FET-based transconductance circuit in the input line; and
- a DTSOA-based differentiator ("delta-modulator") circuit receiving signals on the input line and generating an output.

17. The DTSOA circuit of claim 16, comprising at least one feedback element through which the output is sent back to the input line.

* * * * *